(12) United States Patent
Aurongzeb et al.

(10) Patent No.: US 10,727,566 B2
(45) Date of Patent: Jul. 28, 2020

(54) ELECTRICALLY FUNCTIONAL STRUCTURE INTEGRATION IN ULTRATHIN FOLDABLE DEVICE

(71) Applicant: Dell Products L.P., Round Rock, TX (US)

(72) Inventors: Deeder M. Aurongzeb, Austin, TX (US); Nicholas D. Abbatiello, Round Rock, TX (US); Paul J. Doczy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 464 days.

(21) Appl. No.: 15/430,115

(22) Filed: Feb. 10, 2017

(65) Prior Publication Data

US 2018/0235084 A1  Aug. 16, 2018

(51) Int. Cl.
*H01Q 1/22*     (2006.01)
*H05K 1/14*     (2006.01)
*H05K 3/00*     (2006.01)
*H01Q 21/06*    (2006.01)

(52) U.S. Cl.
CPC .......... *H01Q 1/2283* (2013.01); *H05K 1/148* (2013.01); *H05K 3/0064* (2013.01); *H01Q 21/065* (2013.01); *H05K 2201/0999* (2013.01)

(58) Field of Classification Search
CPC .... H01Q 1/2283; H05K 1/148; H05K 3/0064; H05K 2201/0999
See application file for complete search history.

(56) References Cited

U.S. PATENT DOCUMENTS

| 7,829,796 | B2 | 11/2010 | Feider et al. | |
|---|---|---|---|---|
| 8,059,409 | B2 | 11/2011 | Steenwyk et al. | |
| 2014/0145883 | A1* | 5/2014 | Baks | H01Q 1/2283 |
| | | | | 343/700 MS |
| 2015/0235122 | A1* | 8/2015 | Finn | G06K 19/07794 |
| | | | | 235/439 |
| 2015/0245513 | A1* | 8/2015 | Moon | G06F 1/20 |
| | | | | 361/679.01 |
| 2019/0115643 | A1* | 4/2019 | Khan | H01P 5/107 |

* cited by examiner

*Primary Examiner* — William H. Mayo, III
*Assistant Examiner* — Hiram E Gonzalez
(74) *Attorney, Agent, or Firm* — Baker Botts L.L.P.

(57) ABSTRACT

Systems and methods are disclosed for integration of an electrically functional structure in an information handling system. An information handling system may include may include a housing including a first housing portion coupled to a second housing portion. The first housing portion may include an electrically functional structure integrated within the first housing portion. The first housing portion may also include a first layer and a structural adhesive applied to the first layer. The first housing portion may further include a second layer and a thermally conductive adhesive applied to the second layer to bond the second layer to the first layer. The first housing portion may also include a PCB layer coupled between a first PCB and a second PCB, the PCB layer bonded to the second layer, and the electrically functional structure includes the first PCB and the second PCB.

6 Claims, 12 Drawing Sheets

ELECTRICALLY FUNCTIONAL STRUCTURE INTEGRATION IN ULTRATHIN FOLDABLE DEVICE

BACKGROUND

Field of the Disclosure

This disclosure relates generally to information handling systems and, more particularly, to a narrow border plastic cover for an information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include portable information handling systems, such as, smart phones, tablet computers, notebook computers, media players, digital cameras, 2-in-1 tablet-laptop combination computers, wireless organizers, and/or combinations thereof. An information handling system may generally be any device that a user may carry for handheld use and that includes a processor. Advancements in packaging design and the reduction of the size of various components included in portable information handling systems have reduced both the thickness and weight of information handling systems. Portable information handling system designs have typically used metal housing to incorporate these improvements and achieve the thickness and weight reductions. While the size reductions of the various components will allow for thinner designs, the challenges associated with the thermal structure and mechanical integration of those components in a metal housing limit the weight and thickness reductions that can be achieved. Thus, it may be desirable to improve the housing design to reduce the thermal structure and mechanical integration limitations.

SUMMARY

In one aspect, a disclosed information handling system may include a housing including a first housing portion coupled to a second housing portion. The first housing portion may include an electrically functional structure integrated within the first housing portion. The first housing portion may also include a first layer having a first flexible portion, a first edge portion, and a second edge portion, the first flexible portion between the first edge portion and the second edge portion, and a structural adhesive applied to the first edge portion and the second edge portion of the first layer. The first housing portion may further include a second layer having a second flexible portion and a thermally conductive adhesive applied to the second layer to bond the second layer to the first layer. The first housing portion may also include a printed circuit board (PCB) layer including a third flexible portion coupled between a first PCB and a second PCB, the PCB layer bonded to the second layer, and the electrically functional structure includes the first PCB and the second PCB.

In any of the disclosed embodiments of the information handling system, the first flexible portion, the second flexible portion, and the third flexible portion may correspond to a flexible portion of a display of the information handling system.

In any of the disclosed embodiments of the information handling system, the first layer may include one or more of an Aramid fiber, a carbon fiber, and a thermoplastic elastomer including a carbon nanotube fiber.

In any of the disclosed embodiments of the information handling system, the second layer include one or more of a glass fiber, an Aramid fiber, and a carbon fiber.

In any of the disclosed embodiments of the information handling system, the PCB layer may include one or more of a flexible circuit polymer and a polyamide based polymer.

In any of the disclosed embodiments of the information handling system, the information handling system may be configured to allow the first housing portion to fold in relation to the second housing portion.

In another aspect, a disclosed information handling system may include a display and a housing portion. The housing portion may include a fiber having a grove and coupled to the display. The housing portion may also include an electrically functional structure including a cable placed in the grove of the fiber. The housing portion may further include a resin applied to the fiber and the cable to bond the cable to the fiber.

In any of the disclosed embodiments of the information handling system, the fiber may include one or more of an Aramid fiber, a carbon fiber, and a TPE including a carbon nanotube fiber. In any of the disclosed embodiments of the information handling system, the housing portion may also include a cover portion that may include a surface mount device coupled to a PCB and a fiber layer, the PCB and the surface mount device insert molded to the fiber layer using an insert mold polyamide.

In any of the disclosed embodiments of the information handling system, the cover portion may be laminated with one or more of a polymer fiber, a glass fiber, a basalt fiber, an ultra-high-molecular-weight polyethylene (UHMWPE) fiber, a high-modulus polyethylene (HMPE) fiber, a high-performance polyethylene (HPPE) fiber, a polybenzoxazole (PBO) fiber, a para-aramid fiber, and a polyhydroquinone diimidazopyridine (M5) fiber.

In any of the disclosed embodiments of the information handling system, the surface mount device may be an antenna.

In yet another aspect, a disclosed information handling system may include a housing portion that may include an electrically functional structure including an antenna. The housing portion may also include a cover portion one or more housing layers. The housing portion may further include a patterned hole in the cover portion and the one or more housing layers, the patterned hole may be filled by the antenna to integrate the antenna in the housing portion. The cover portion, the one or more housing layers, and the electrically functional structure including the antenna may be bonded to each other using a lamination process to create a composite material.

In any of the disclosed embodiments of the information handling system, the patterned hole may be filled by the antenna using three dimensional printing to print the antenna in the patterned hole.

In any of the disclosed embodiments of the information handling system, the patterned hole may be filled by the antenna using an injection process to inject the antenna in the patterned hole.

In any of the disclosed embodiments of the information handling system, the patterned hole may be laser cut into the cover portion and the one or more housing layers using a three dimensional pattern of the antenna.

In any of the disclosed embodiments of the information handling system, the cover portion may be laminated with one or more of a polymer fiber, a glass fiber, a basalt fiber, an ultra-high-molecular-weight polyethylene (UHMWPE) fiber, a high-modulus polyethylene (HMPE) fiber, a high-performance polyethylene (HPPE) fiber, a polybenzoxazole (PBO) fiber, a para-aramid fiber, and a polyhydroquinone diimidazopyridine (M5) fiber.

In any of the disclosed embodiments of the information handling system, the antenna may include an antenna material of liquid silver ink and a ceramic antenna base.

In any of the disclosed embodiments of the information handling system, the antenna may be one or more of a multi-frequency antenna, a wave antenna array, a microstrip patch circular array antenna, and a compact grid array antenna.

In any of the disclosed embodiments of the information handling system, the antenna may be a microstrip patch circular array antenna having a plurality of rectangular microstrip patch elements, and each rectangular microstrip patch is fed by a coaxial line.

In any of the disclosed embodiments of the information handling system, the antenna may be a compact grid array antenna implemented using a FR-4 substrate.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
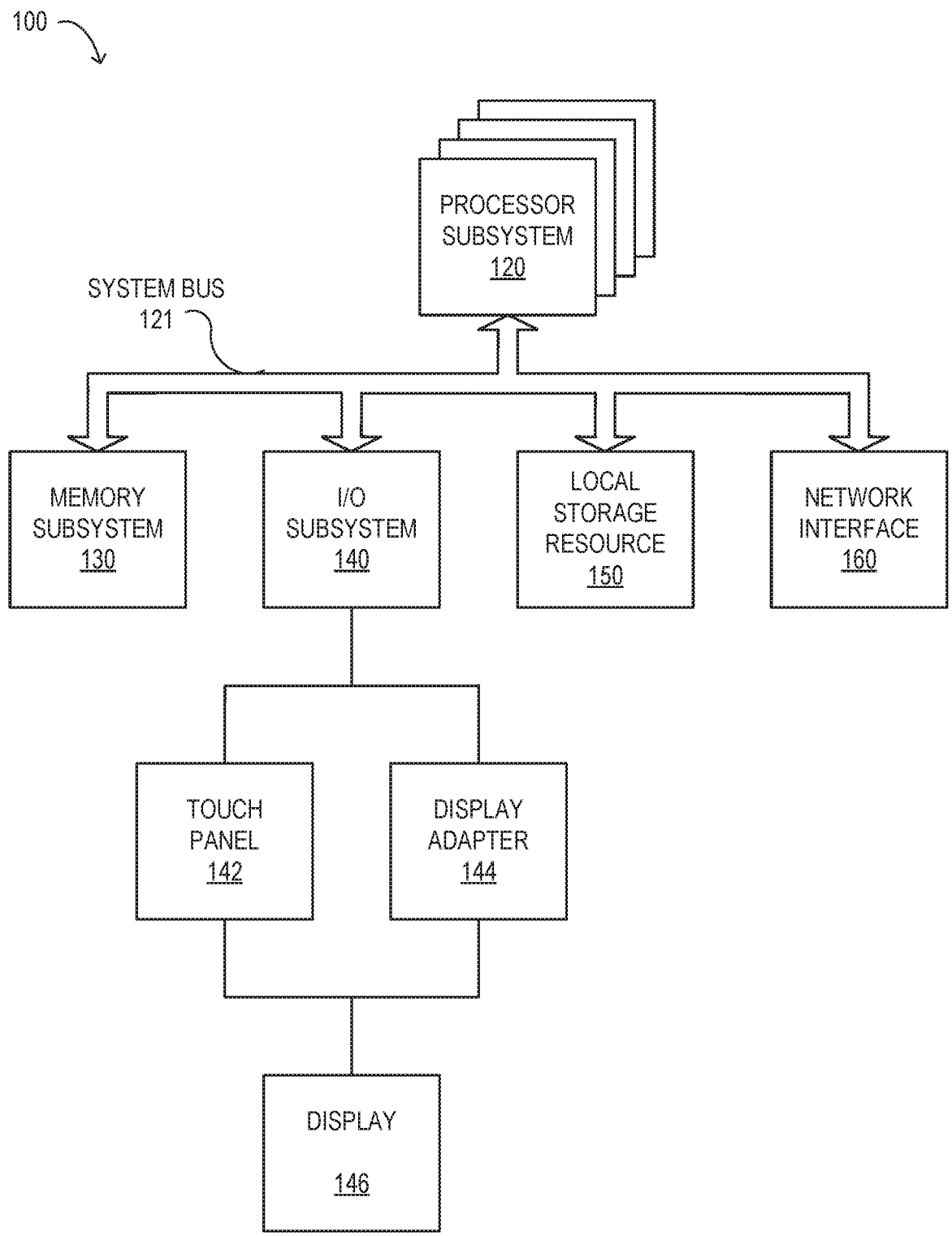
FIG. 1 is a block diagram of selected elements of an embodiment of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, widget "72-1" refers to an instance of a widget class, which may be referred to collectively as widgets "72" and any one of which may be referred to generically as a widget "72."

As noted previously, advancements in packaging design have resulted in size reductions of various components included in information handling systems that may allow for thinner designs of the information handling systems. These thinner designs may utilize a metal housing to house the various components included in the information handling systems. The mechanical integration of the various components in the metal housing may add thickness to the housing, resulting in thickness reduction limitations. In order to meet thermal design specifications, the thermal structure may also add to the thickness of the housing, further limiting the thickness reductions that can be achieved. As described in more detail below, a housing may be designed using multiple layers fixed together to form a composite material having electrically functional structures integrated in the composite material, which may allow thinner and more lightweight information handling systems.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-9 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of information handling systems, such as, smart phones, tablet computers, notebook computers, media players, digital cameras, 2-in-1 tablet-laptop combination computers, and wireless organizers. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

In FIG. 1, network interface 160 may be a suitable system, apparatus, or device operable to serve as an interface between information handling system 100 and a network. Network interface 160 may enable information handling system 100 to communicate over the network using a suitable transmission protocol and/or standard, including, but not limited to, transmission protocols and/or standards enumerated below with respect to the discussion of the network. In some embodiments, network interface 160 may be communicatively coupled via the network to a network storage resource. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). The network may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. The network and its various components may be implemented using hardware, software, or any combination thereof.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in a network storage resource, not shown).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. As shown, I/O subsystem 140 may comprise touch panel 142 and display adapter 144. Touch panel 142 may include circuitry for enabling touch functionality in conjunction with display 146 that is driven by display adapter 144.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data. In system 100, I/O subsystem 140 may comprise a system, device, or apparatus generally operable to receive and/or transmit data to/from/within system 100. In addition to local storage resources 150, in some embodiments, information handling system 100 may communicatively couple via network 165 to a network storage resource (not shown) using network interface 160 discussed below.

Network interface 160 may be a suitable system, apparatus, or device operable to serve as an interface between information handling system 100 and network 165. Network interface 160 may enable information handling system 100 to communicate over network 165 using any suitable transmission protocol and/or standard, including, but not limited to various transmission protocols and/or standards. Network 165 coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data or information). In some embodiments, network 165 communicatively coupled to network interface 160 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 165, network interface 160, and/or various components associated therewith may be implemented using hardware, software, or any combination thereof. Network interface 160 may enable wired and/or wireless communications to and/or from information handling system 100.

Figure 2:
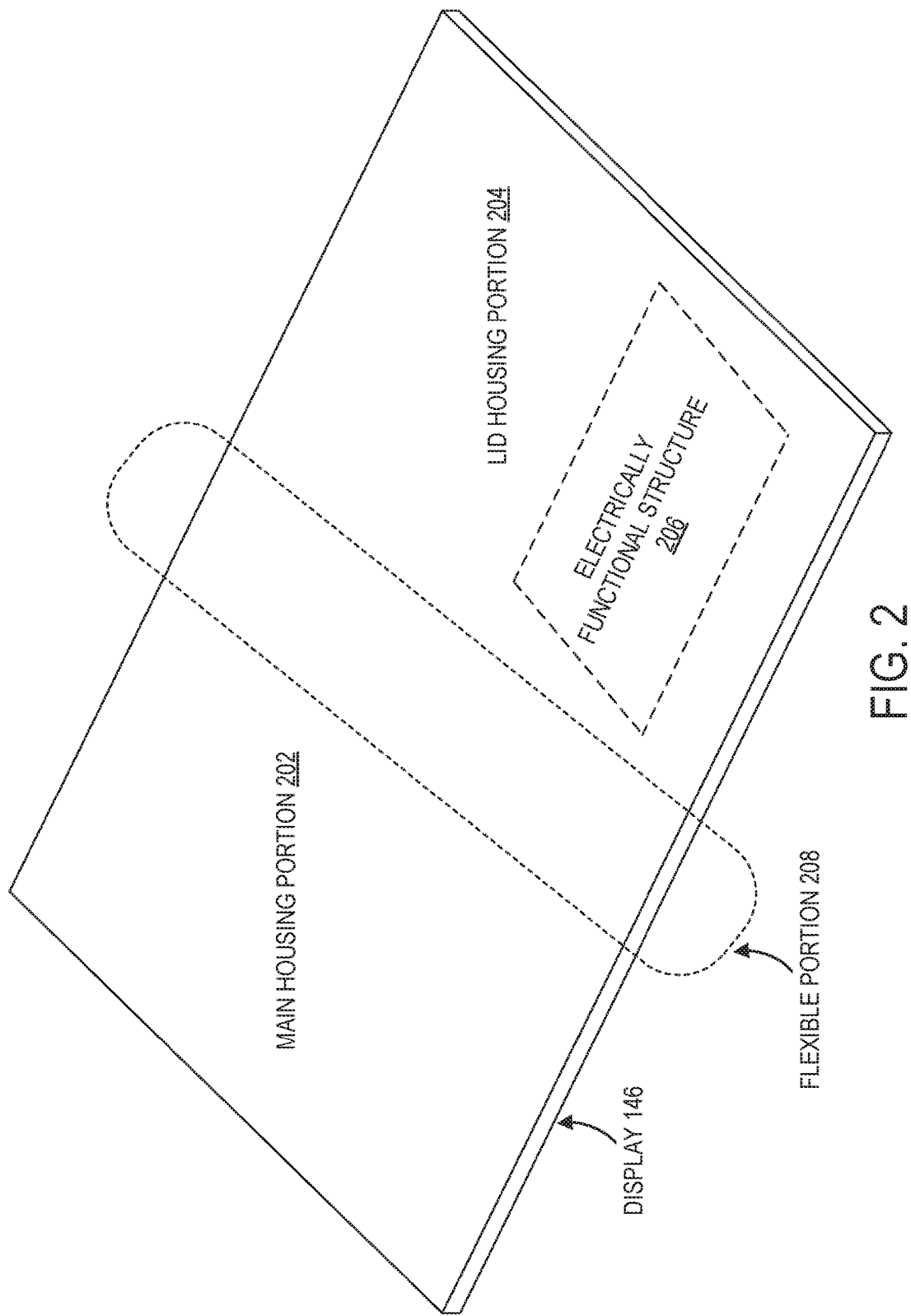
FIG. 2 illustrates a perspective view of selected elements of an embodiment of an information handling system including an electrically functional structure within a housing.

Turning now to FIG. 2, is a perspective view of selected elements of an embodiment of a portable information handling system including an electrically functional structure within a housing. In the example embodiment, a portable information handling system 200 may include a main housing portion 202 coupled to a lid housing portion 204 to support various configurations to interact with an end user. Main housing portion 202 and lid housing portion 204 may each comprise one or more layers fixed together to form a composite material allowing the housing portions 202 and 204 to be thin and lightweight. Lid housing portion 204 may include at least one electronically functional structure 206 integrated in the composite material. Electrically functional structure 206 may be a flexible functional structure such as a flexible circuit. In one or more embodiments, electronically functional structure 206 may include one or more cables (also referred herein as wiring) from an antenna, an audio device, an input/output device, a printed circuit board (PCB), among other electronic devices. Electronically functional structure 206 may also include an antenna element, one or more multiple-input and multiple-output antennas, a PCB, and other types of electronic devices. As explained below in further detail, integrating electronically functional structure 206 in the composite material of main housing portion 202 and lid housing portion 204 may reduce the thickness, width, and/or depth of main housing portion 202 and lid housing portion 204, which may allow the thickness of portable information handling system 200 to be reduced.

Main housing portion 202 and lid housing portion 204 may include one or more components of portable information handling system 200, including but not limited to processor subsystem 120, system bus 121, memory subsystem 130, I/O subsystem 140, local storage resource 150, network interface 160, touch panel 142, display adapter 144, and display 146 discussed above with respect to FIG. 1. In one or more embodiments, connections between the one or more components of portable information handling system 200 may be metallized in main housing portion 202 and lid housing portion 204. In one or more embodiments, the connections between the one or more components of portable information handling system 200 may be a combination of molding cable connected to embedded tracing of main housing portion 202 and lid housing portion 204, described in further detail below. By including the connections in main housing portion 202 and lid housing portion 204, necking is eliminated.

In some embodiments, portable information handling system 200 may include a flexible portion 208 of main housing portion 202 and lid housing portion 204 such that a user may bend or rotate main housing portion 202 and/or lid housing portion 204 relative to each other.

In some embodiments, portable information handling system 200 may include one or more displays for visually presenting information. For example, display 146 may be touch panel 142 with circuitry enabling touch functionality in conjunction with a display such that a user may provide input to portable information handling system 200 through the display. In some embodiments, display 146 may be flexible such that it can bend and change shapes while still visually presenting information to and/or accepting input from the user. For example, display 146 may be an organic light-emitting diode (OLED) formed on a flexible plastic, such as polyethylene terephthalate. In some embodiments, display 146 may couple to main housing portion 202 and lid housing portion 204 such that flexible portion 208 of display 146 corresponds to flexible portion 208 of main housing portion 202 and lid housing portion 204.

In some embodiments, main housing portion 202 may include a keyboard on a top portion of main housing portion 202. In some embodiments, display 146 may be placed over main housing portion 202, lid housing portion 204, and flexible portion 208 of portable information handling system 200 and configured to bend when main housing portion 202 and lid housing portion 204 bends relative to each other. Flexible portion 208 of portable information handling system 200 may allow main housing portion 202 and lid housing portion 204 to rotate between a plurality of positions. For example, when portable information handling system 200 is not in use, lid housing portion 204 may be closed over the top of main housing portion 202 so that display 146 is protected from unintended use or damage. Display 146 may also bend at varying degrees as portable information handling system 200 is moved between positions. In any position, user inputs may be communicated to an I/O subsystem and/or processor subsystem of the portable information handling system for processing, and then updated information may be communicated back to display 146 for displaying to the user.

Figure 3:
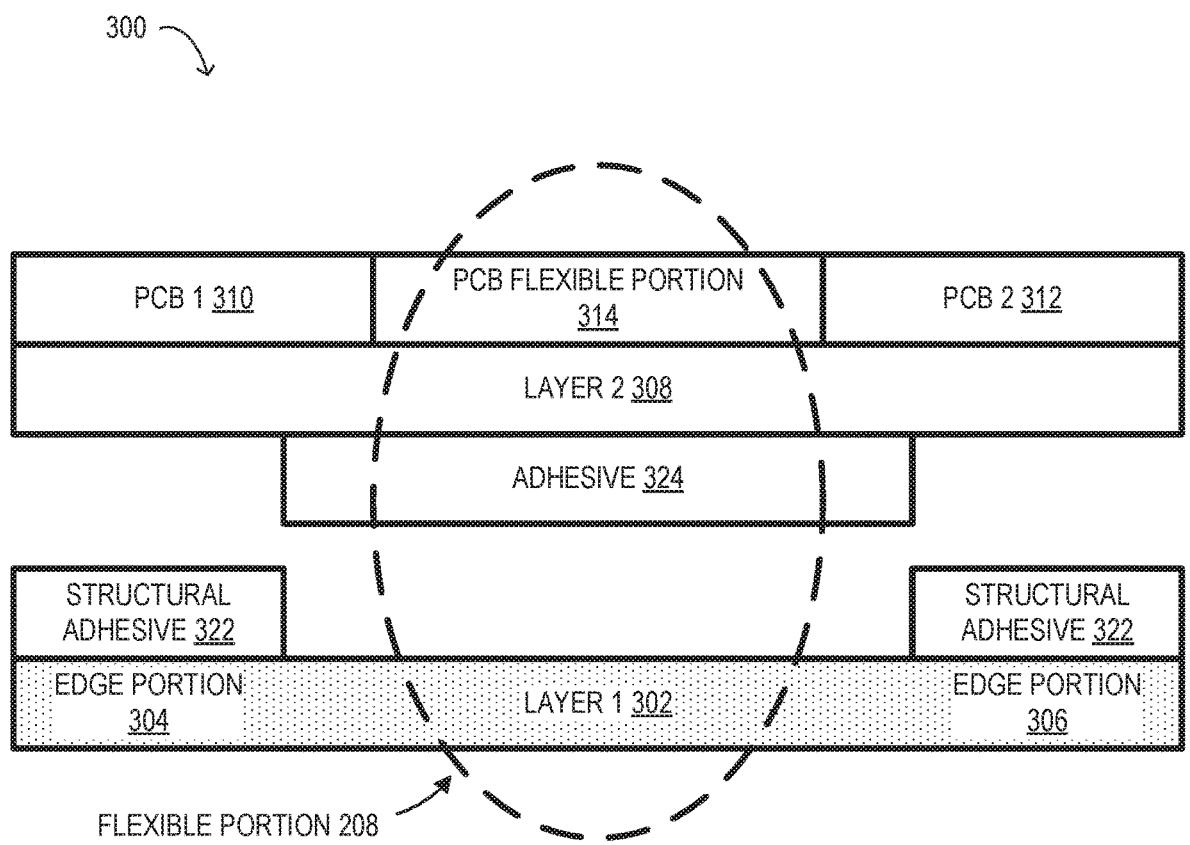
FIG. 3 illustrates a side view of selected elements of an embodiment of a composite housing portion including integrated PCBs of an information handling system.

Turning now to FIG. 3, is a side view of selected elements of an embodiment of a composite housing portion 300 including integrated PCBs of an information handling system. Composite housing portion 300 may include one or more of main housing portion 202 and lid housing portion 204 of information handling system 200. As shown, composite housing portion 300 may include a layer 1 302 having flexible portion 208 between an edge portion 304, and an edge portion 306. Layer 1 302 may include one or more of an Aramid fiber, a carbon fiber, a thermoplastic elastomer (TPE) including a carbon nanotube fiber, a Graphene sheet, and other types of fiber. Composite housing portion 300 may also include a structural adhesive 322 applied to edge portion 304 and an edge portion 306 of layer 1 302. For example, structural adhesive 322 may be an epoxy adhesive, an Ester of an Epoxy (EPE) resin, a ultra-violet curable epoxy, an infrared curable epoxy, a resin including a hardener, a resin including a flexible hardener, an Acrylic adhesive, a Urethane adhesive, and other types of structural adhesives. Structural adhesive 322 may be a low stress conductive adhesive.

Composite housing portion 300 may further include a layer 2 308 having flexible portion 208, and a thermally conductive adhesive 324, which may be applied to layer 2 308 to bond, along with structural adhesive 322, layer 2 308 to layer 1 302. Layer 2 308 may include one or more of a glass fiber, an Aramid fiber, a carbon fiber, a Graphene sheet, and other types of fiber. Thermally conductive adhesive 324 may be a pressure sensitive adhesive. Carbon fiber is typically conductive, while in the resin, the surface is almost an insulator. Coupling between layer 1 302 and layer 2 308 may be avoided by laminating layer 1 302 to layer 2 308 with the low stress conductive adhesive of structural adhesive 322, followed by the pressure sensitive adhesive of thermally conductive adhesive 324 to layer 2 308.

Composite housing portion 300 may also include a PCB flexible portion 314 coupled between a PCB 1 310 and a PCB 2 312 integrated in a PCB layer, where electrically functional structure 206 of portable information handling system 200 may include PCB 1 310 and PCB 2 312. The PCB layer may include one or more of a flexible circuit polymer, a polyamide based polymer, a high temperature polymer, and other type of polymers. PCB flexible portion 314 may correspond to flexible portion 208. The PCB layer may be bonded to layer 2 308 to form composite housing portion 300 including layer 1 302, layer 2 308, and the PCB layer having PCB 1 310, PCB 2 312, and PCB flexible portion 314. Integrating the PCB layer in composite housing portion 300 increases space and reduces stress. Layered composite housing portion 300 allows the use of specific stack layers, which may minimize the thickness of composite housing portion 300 while allowing it to be semi-flexible.

In one or more embodiments, structural adhesive 322 and thermally conductive adhesive 324 may include a graphene filler which results in the adhesives having a lower coefficient of thermal expansion (CTE) while providing good coupling to layer 1 302 to layer 2 308. Layer 1 302 and/or layer 2 308 may include a Graphene sheet instead of a carbon fiber and/or Aramid fiber to increase heat conduction heat and meet thermal specification of a portable information handling system, e.g. portable information handling system 200. For example, Graphene has a thermal conductance of approximately 1000 Watts/Kelvin-Meters while a carbon fiber with resin only has a thermal conductance of approximately 2 Watts/Kelvin-Meters.

Composite housing portion 300 may be coupled to display 146 of portable information handling system 200. Flexible portion 208 of composite housing portion 300 allows composite housing portion 300 to fold and bend in relation to display 146. When display 146 has a larger surface, e.g. greater than ten inches (10") in diagonal, the split PCB of PCB 1 310 and PCB 2 312 may be used and electrically functional structure 206 may be a flexible circuit embedded in layered laminate of the PCB layer using a porous adhesive. The porous adhesive may include a low stress conductive adhesive with fillers to increase conduction and its porosity. The presence of porosity in the laminate of the PCB layer changes both the transfer of force between PCB flexible portion 314 and PCB 1 310 and PCB 2 312 while embedding will improve the adhesion of the porous adhesive. This allows the stress at PCB flexible portion 314 to be dampened when flexing is induced.

When display 146 has a smaller surface, e.g. less than ten inches (10") in diagonal, the thickness of composite housing portion 300 may be reduced, resulting in a reduction in thickness of portable information handling system 200. For example, for display 146 having a smaller surface less than ten inches in diagonal, the reduction in thickness of composite housing portion 300 may result in a 1 mm reduction in thickness of portable information handling system 200.

Figure 4:
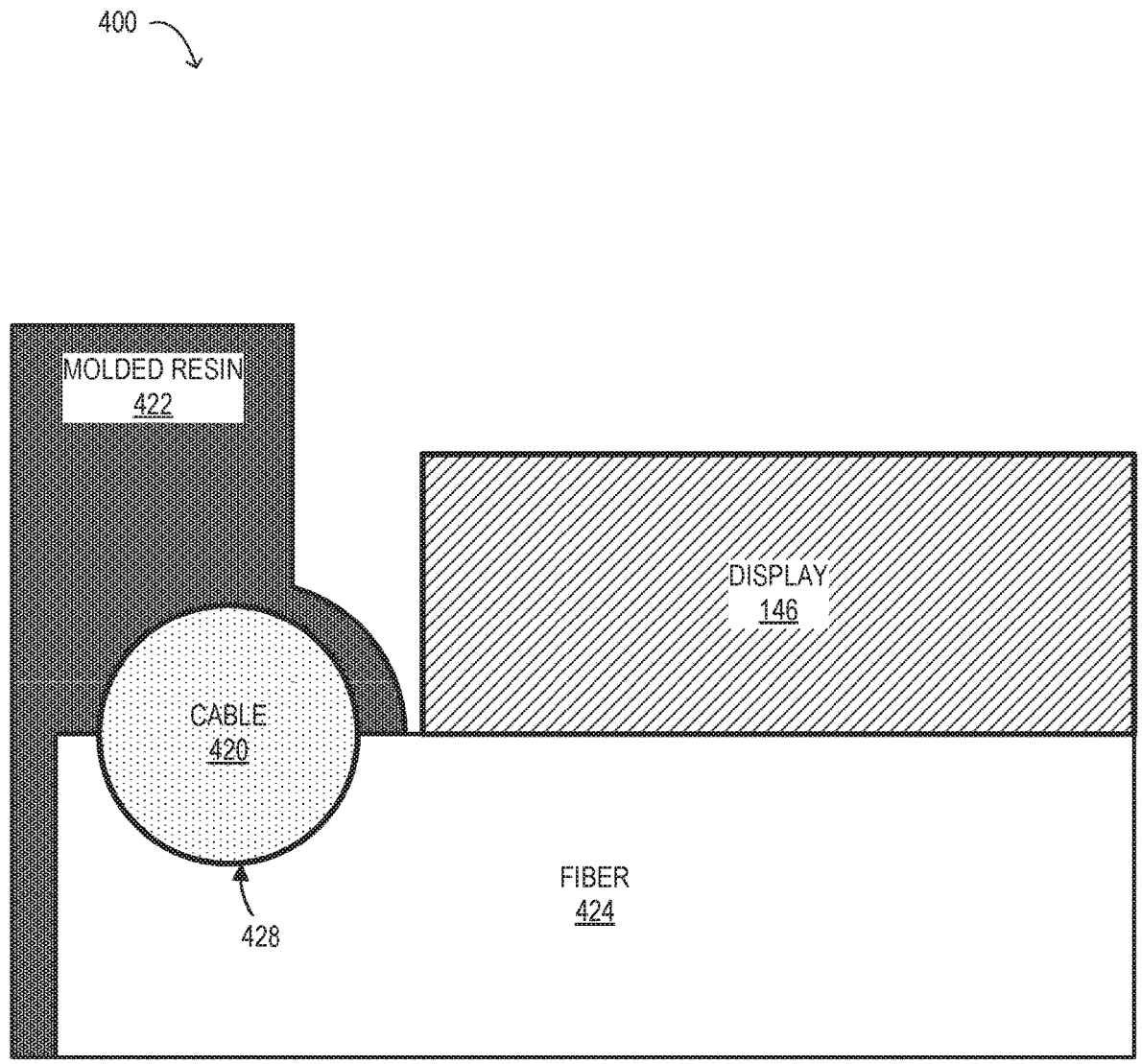
FIG. 4 illustrates a side view of selected elements of an embodiment of a composite housing portion including an integrated cable of an information handling system.

Turning now to FIG. 4, is a side view of selected elements of an embodiment of a composite housing portion 400 including an integrated cable of an information handling system. Composite housing portion 400 may include one or more of main housing portion 202 and lid housing portion 204 of information handling system 200. As shown, composite housing portion 400 may include a fiber 424 having a groove 428 coupled to display 146. Fiber 424 is an insulating composite. In some embodiments, the fiber may include one or more of an Aramid fiber, a carbon fiber, a TPE including a carbon nanotube fiber, and other types of fiber. Composite housing portion 400 may also include a cable 420 coupled to display 146 that may be placed in groove 428 of fiber 424 to hold cable 420 in place. Cable 420 may be a cable from an antenna, an audio device, an input/output device, a printed circuit board (PCB), among other electronic devices. Electrically functional structure 206 of portable information handling system 200 may include cable 420. In some embodiments, groove 428 may be machined into fiber 424. In some embodiments, groove 428 may be laser channeled into fiber 424.

A molded resin 422 may be applied to fiber 424 and cable 420 to bond cable 420 to fiber 424. Molded resin 422 may be one or more of a polyurethane filler, a two-part acrylic epoxy, a carbon fiber thermoplastic resin, an epoxy adhesive, an Ester of an Epoxy (EPE) resin, a ultra-violet curable epoxy, an infrared curable epoxy, a resin including a hardener, a resin including a flexible hardener, an Acrylic adhesive, a Urethane adhesive, and other types of resins. Molded resin 422 fills around cable 420 and fiber 424 to and integrate cable 420 in composite housing portion 400 including fiber 424, cable 420, and molded resin 422. Molded resin 422 may be molded in, or directly applied to bond to cable 420 and fiber 424, which may allow composite housing portion 400 to take distortion and vibration without debonding. Forming composite housing portion 400 in this manner allows cable 420 to be folded directly when composite housing portion 400 is folded.

Figure 5:
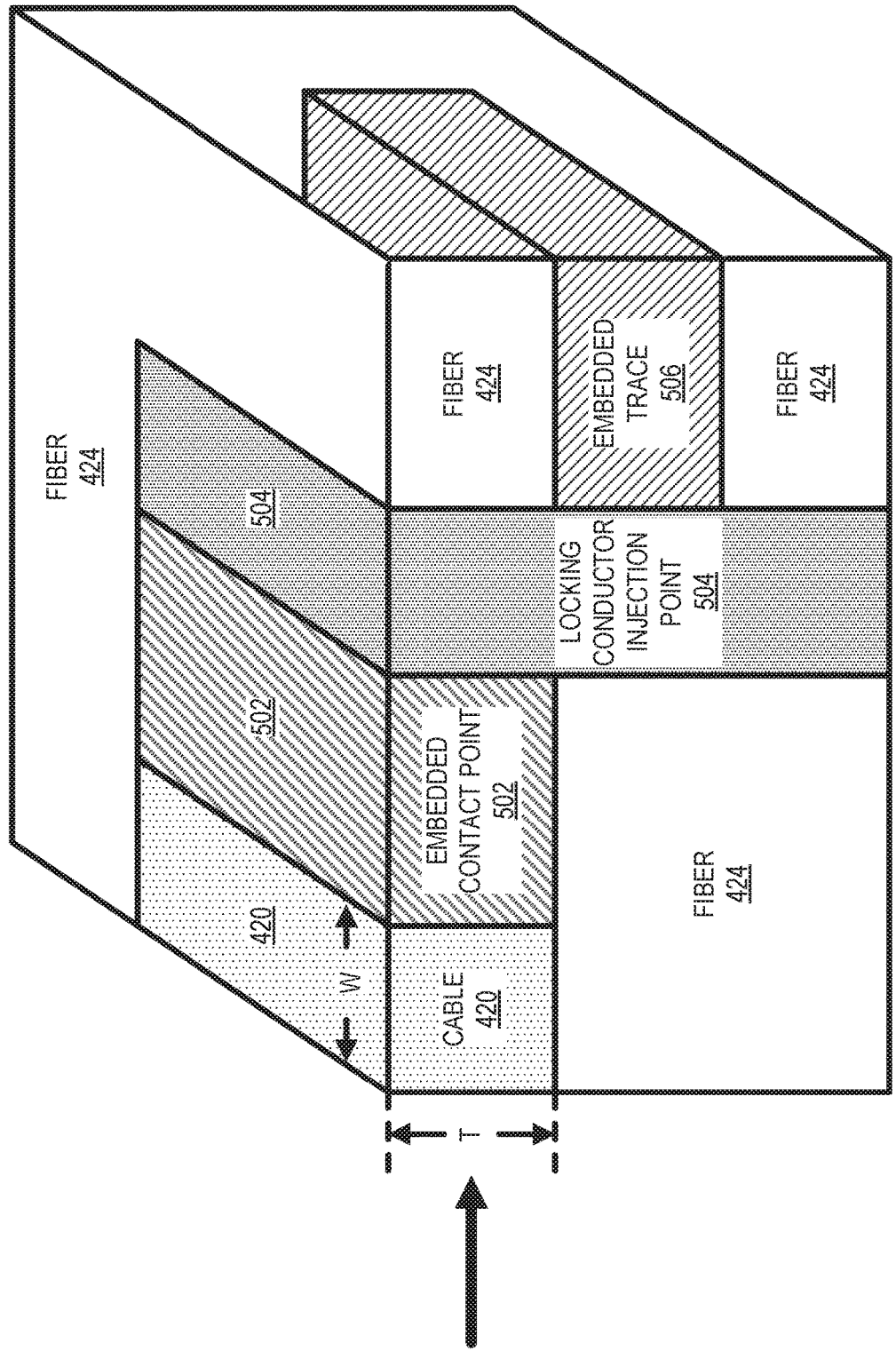
FIG. 5 illustrates a perspective view of selected elements of an embodiment of a composite housing portion including an integrated cable of an information handling system.

Turning now to FIG. 5, is a perspective view of selected elements of an embodiment of a composite housing portion 500 including an integrated cable of an information handling system. Composite housing portion 500 may include one or more of main housing portion 202 and lid housing portion 204 of information handling system 200. Composite housing portion 500 shows a more detailed view of composite housing portion 400 of FIG. 4. In particular, composite housing portion 500 depicts the cable to embedding tracing transition. Composite housing portion 500 may include cable 420 at an entry point, represented by the incoming arrow to composite housing portion 500, coupled to fiber 424 as previously described. Composite housing portion 500 may also include an embedded contact point 502 coupled between cable 420 and a locking conductor injection point 504. Composite housing portion 500 may further include an embedded trace 506 coupled to locking conductor injection point 504, which completes the embedded trace transition of cable 420 to embedded trace 506 via embedded contact point 502 and locking conductor injection point 504.

Figure 6:
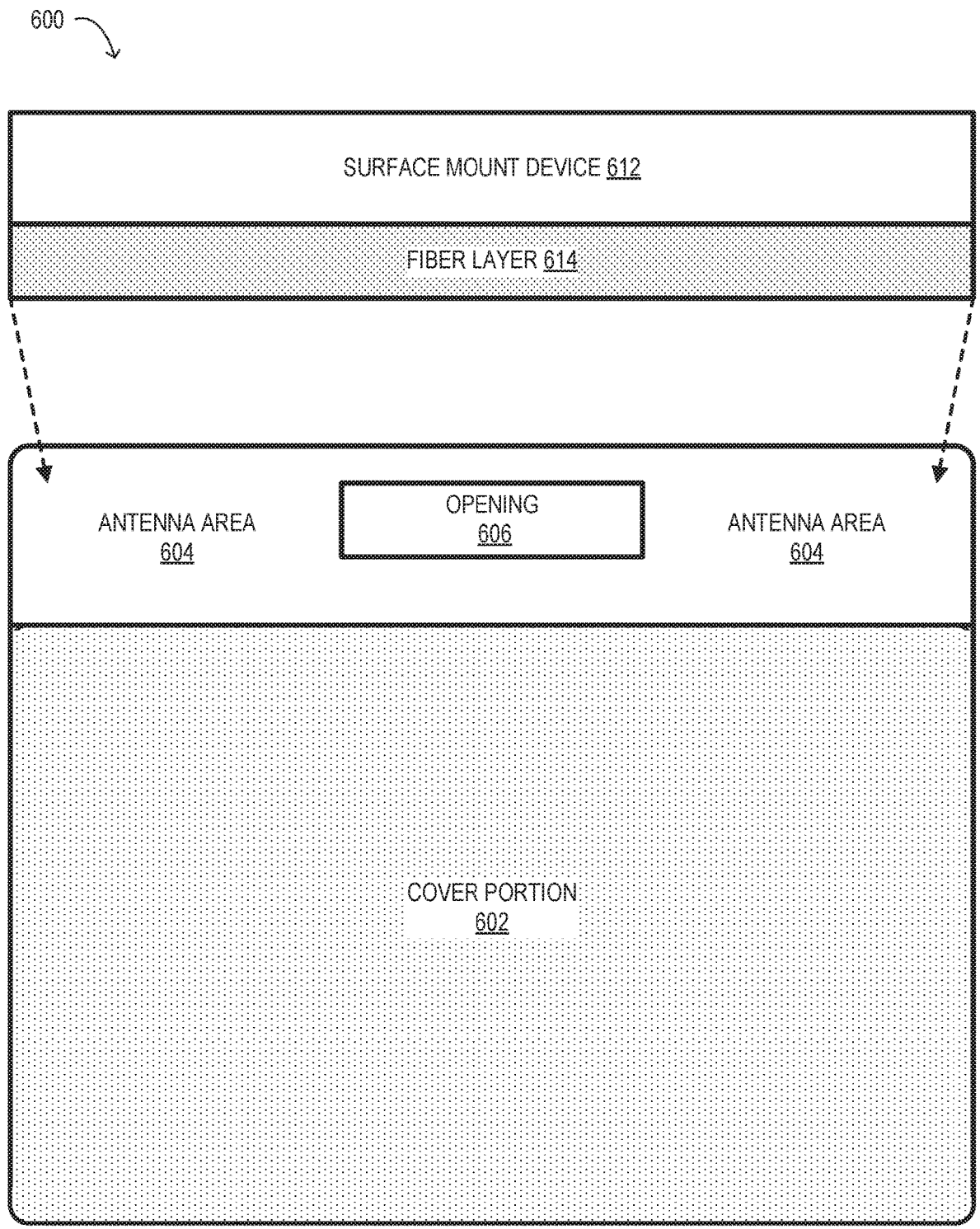
FIG. 6 illustrates selected elements of an embodiment of a composite housing portion 600 including a surface mount device of an information handling system.

Turning now to FIG. 6, selected elements of an embodiment of a composite housing portion 600 including a surface mount device of an information handling system are illustrated. Composite housing portion 600 may be one of main housing portion 202 and lid housing portion 204 of portable information handling system 200. Composite housing portion 600 may include a cover portion 602 having an antenna area 604 and an opening 606. Cover portion 602 may include a surface mount device 612 coupled to a PCB and a fiber layer 614. Surface mount device 612 may be an antenna element, one or more multiple-input and multiple-output antennas, and other types of electronic devices. The PCB may be a PCB polymer described above. Fiber layer 614 may include one or more of an Aramid fiber, a carbon fiber, a thermoplastic elastomer (TPE) including a carbon nanotube fiber, and other types of fiber. Surface mount device 612 and the PCB may be insert molded to fiber layer 614 in antenna area 604 of cover portion 602 using an insert mold polyamide. In one or more embodiments, the PCB polymer of the PCB may be part of fiber layer 614 by insert molding, lamination of both. Electrically functional structure 206 may include surface mount device 612. In one or more embodiments, cover portion 602 is the PCB. Tracing the circuit and mounting surface mount device 612 on cover portion 602 may reduce the overall thickness of portable information handling system 200.

Figure 7A:
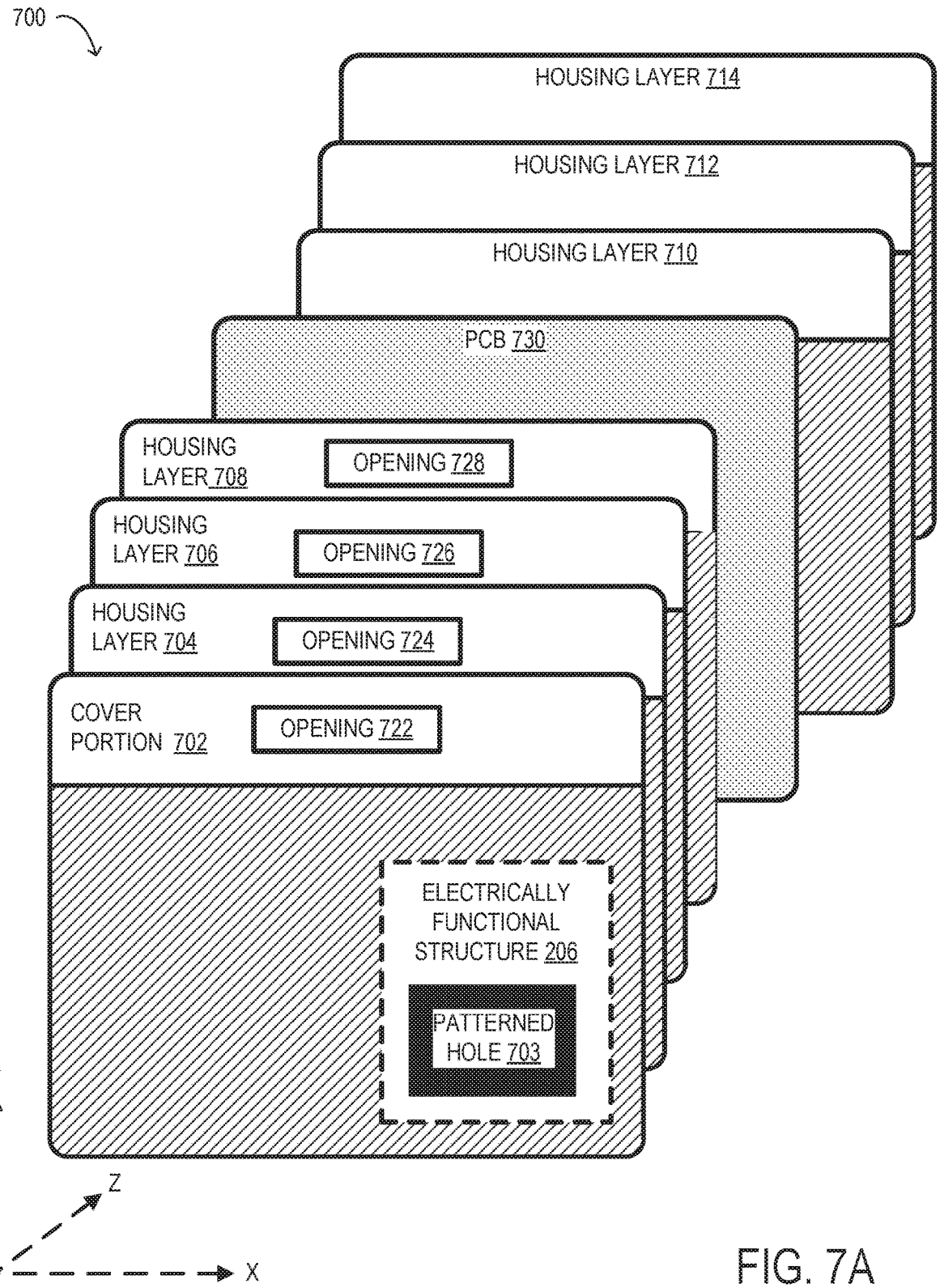
FIGS. 7A and 7B illustrate a three dimensional perspective view of selected elements of an embodiment of a composite housing portion including an electrically functional structure of an information handling system.
Figure 7B:
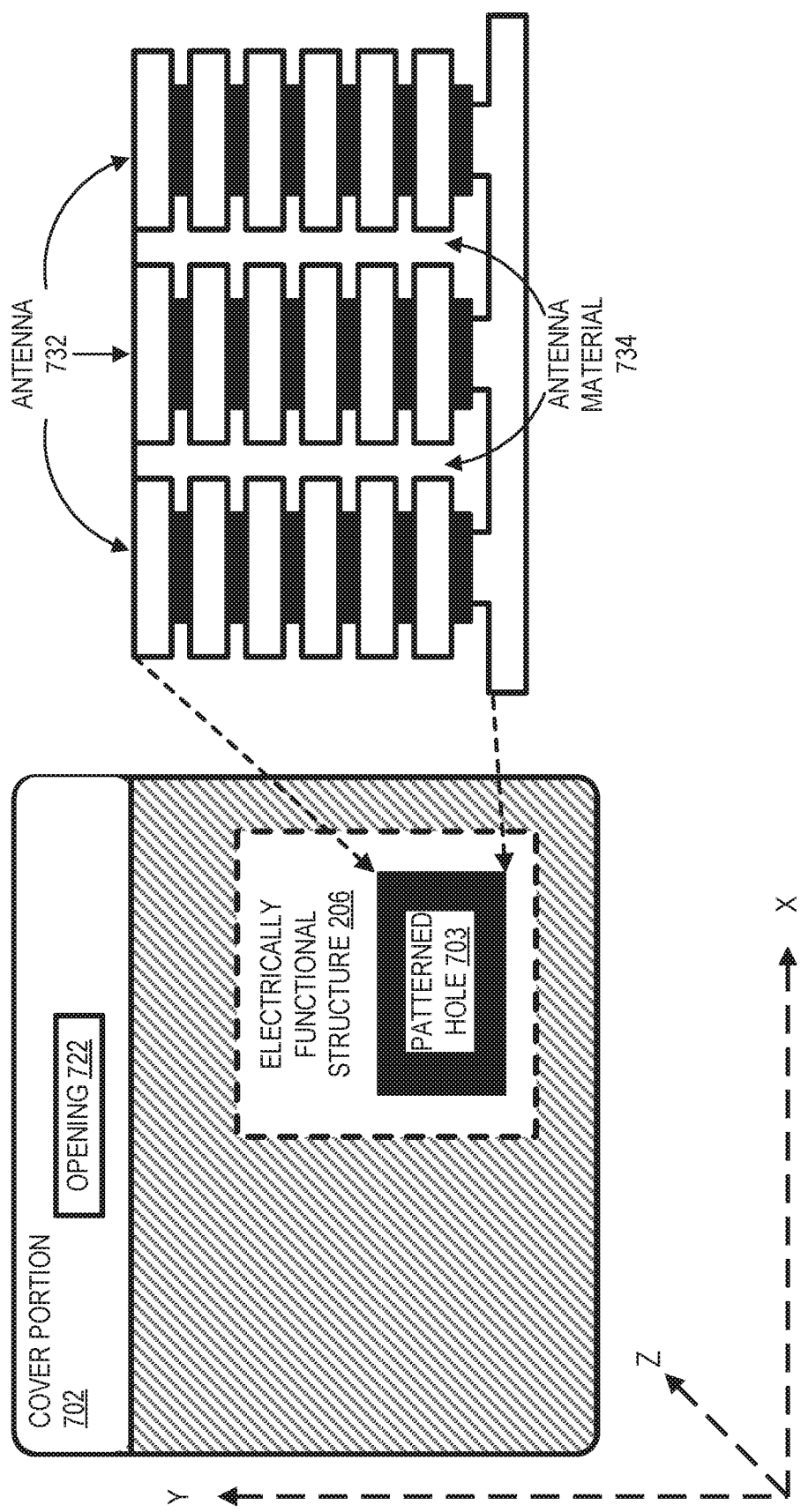

Turning now to FIGS. 7A and 7B, three dimensional perspective views of selected elements of an embodiment of a composite housing portion 700 including an electrically functional structure of an information handling system is illustrated. Composite housing portion 700 has a width in the X direction, a height in the Y direction, and a depth/thickness in a Z direction of the three dimensions. Composite housing portion 700 may be one or more of main housing portion 202 and lid housing portion 204 of portable information handling system 200. Composite housing portion 700 may include a cover portion 702 having electrically functional structure 206 and an opening 722. Cover portion 702 may comprise high-performance fibers with high strength including one or more of a polymer fiber, a glass fiber, basalt fiber, an ultra-high-molecular-weight polyethylene (UHMWPE) fiber, a high-modulus polyethylene (HMPE) fiber, a high-performance polyethylene (HPPE) fiber, a polybenzoxazole (PBO) fiber, a para-aramid fiber, and a polyhydroquinone diimidazopyridine (M5) fiber.

Composite housing portion 700 may also include one or more housing layers including a housing layer 704 have an opening 724, a housing layer 706 having an opening 726, a housing layer 708 having an opening 728, a housing layer 710, a housing layer 712, a housing layer 714, and a PCB 730. Openings 722, 724, 726, and 728 may correspond with each other. Composite housing portion 700 may also include a patterned hole 703 having a width in the X direction, a height in the Y direction, and a depth/thickness in a Z direction. One or more of cover portion 702, electrically functional structure 206, housing layers 704, 706, and 708, PCB 708, and housing layers 710, 712, and 714 may be bonded to each other by one or more of a bonding process and a lamination process, and the like to form main housing portion 202 and lid housing portion 204 of composite housing portion 700. Bonding in this manner, may minimize the thickness of portable information handling system 200. Electrically functional structure 206 may have a height and width in the X and Y directions that minimizes its thickness in the Z direction, which may allow it to fit within one or more of cover portion 702 and the housing layers of composite housing portion 700 without increasing the thickness of portable information handling system 200, described in further detail below with reference to FIG. 7B. In an exemplary embodiment, cover portion 702, housing layers 704, 706, 708, 710, 712, and 714, may each be 0.2 mm thick and PCB 730 may be 0.1 mm thick, which results in portable information handling system 200 being 1.3 mm thick.

Turning now to FIG. 7B, selected elements of an embodiment of composite housing portion 700 comprising electrically functional structure 206 including an antenna of an information handling system is illustrated. Electrically functional structure 206 may comprise an antenna 732 having a width in the X direction, a height in the Y direction, and a depth in a Z direction. Antenna 732 may include an antenna material 734, and an antenna base. Antenna 732 may be a multi-frequency antenna, a Wi-Fi antenna, a directed antenna, and other types of antennas. Antenna material 734 may be liquid silver ink, and the antenna base may be a ceramic antenna base.

In one or more embodiments, a lamination process may be used to laminate one or more of housing layers of a composite housing portion. For example, a lamination process may be used to laminate housing layers 704, 706, and 708 of composite housing portion 700. In one or more embodiments, one or more patterned holes may be laser cut, using a 3D pattern, into one or more of a cover portion and housing layers of a composite housing portion. For example, patterned hole 703 may be laser cut into cover portion 702 and housing layers 704, 706, and 708 of composite housing portion 700. Patterned hole 703 may substantially match the size and shape of antenna 732, antenna material 734, and the antenna base, where the width, height and depth of patterned hole 703 are substantially equal to the width, height and thickness of antenna 732, antenna material 734, and the antenna base. Antenna 732, antenna material 734, and the antenna base may be injected in patterned hole 703 using an injection process. In one or more other embodiments, 3D printing may be used to print antenna 732, antenna material 734, and the antenna base in patterned hole 703. Cover portion 702 may also be laminated with a high-performance high strength fiber. The high performance high strength fiber may be a non-conductive fiber. Cover portion 702 may also include an antenna aperture. Since cover portion 702 may comprise a carbon fiber, which is very absorptive of antenna radiation, the aperture may be comprised of a plastic and/or ceramic with a high dielectric. Antenna 732 may be 3D printed in the high dielectric material with a non-conducting window to further improve its operation. As shown in FIG. 7B, antenna 732 is directed in the Z direction.

Creating composite housing portion 700 comprising electrically functional structure 206 including and antenna 732 in this manner may add no or a small amount of additional thickness to portable information handling system 200.

Figure 8:
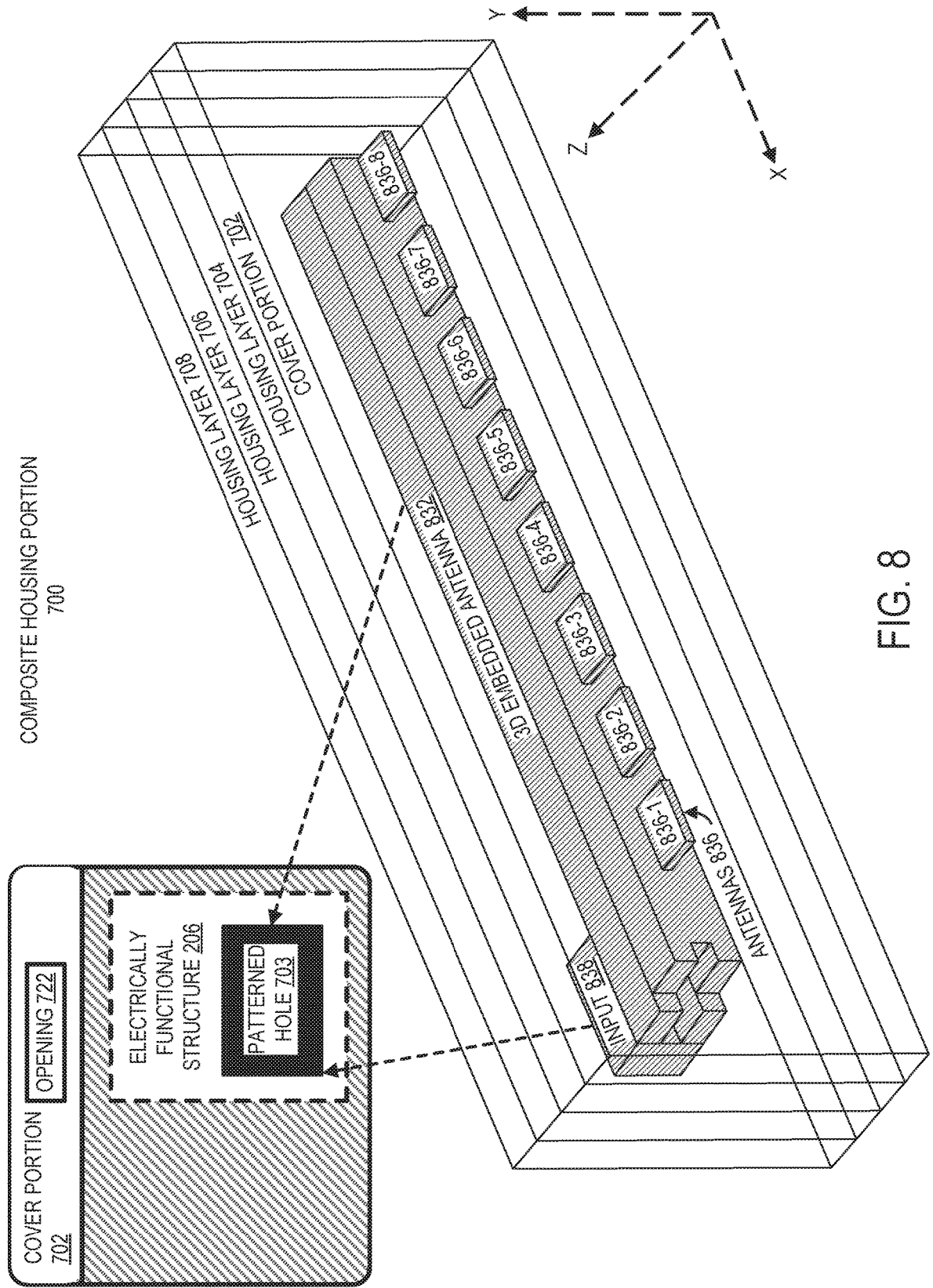
FIG. 8 illustrates selected elements of an embodiment of a composite housing portion including an antenna of an information handling system.

Turning now to FIG. 8, selected elements of an embodiment of composite housing portion 700 comprising an electrically functional structure 206 including a 3D embedded antenna of an information handling system is illustrated. Composite housing portion 700 may include a 3D embedded antenna 832. Electrically functional structure 206 may comprise 3D embedded antenna 832 having a width in the X direction, a height in the Y direction, and a depth in a Z direction. 3D embedded antenna 832 may be an antenna array, which may be a wave antenna array, a microstrip patch circular array antenna, a compact grid array antenna, an N by M element circular array antenna, e.g. a four by four (4×4) element circular array antenna, and other types of antenna arrays. Each of the antenna arrays may be a multi-frequency antenna. 3D embedded antenna 832 may comprise antennas 836 including antennas 836-1, 836-2, 836-3, 836-4, 836-5, 836-6, 836-7, and 836-8, and a wave guide input 838.

Each element of the antenna array may be a rectangular microstrip patch and may be fed by a coaxial line embedded within cover portion 702. The size and feed position of the rectangular microstrip patch may be at a bend portion and directivity may be optimized based on bend or orientation of the rectangular microstrip patch. While the feed of the rectangular microstrip patch is embedded in two dimensions (2D), 3D printing allows the connector of the coaxial line to be feed from 3D dimensions.

The process to create cover portion 702 is substantially the same as previously described with respect to FIG. 7B. In particular, patterned hole 703 may substantially match the size and shape of 3D embedded antenna 832, where the width, height and depth of patterned hole 703 are substantially equal to the width, height and thickness of 3D embedded antenna 832. 3D embedded antenna 832 may be injected in patterned hole 703 using an injection process. In one or more other embodiments, 3D printing may be used to print 3D embedded antenna 832 in patterned hole 703.

When 3D embedded antenna 832 is a multi-frequency antenna, an aperture may be shared. For example, 3D embedded antenna 832 may be a shared aperture 15-28 Ghz wave antenna array based on a three-dimensional (3D) substrate integrated waveguide (SIW) technology.

When 3D embedded antenna 832 is a microstrip patch circular array antenna, it may be implement using a flame retardant-4 (FR-4) substrate. In an exemplary embodiment, a microstrip patch circular array antenna implemented using a FR-4 substrate for 5G mobile communications at 15 Ghz may have a one millimeter (1 mm) thickness in the Z direction and a two by two centimeter (2×2 cm) area in the X and Y directions with a 10-15 array.

Figure 9:
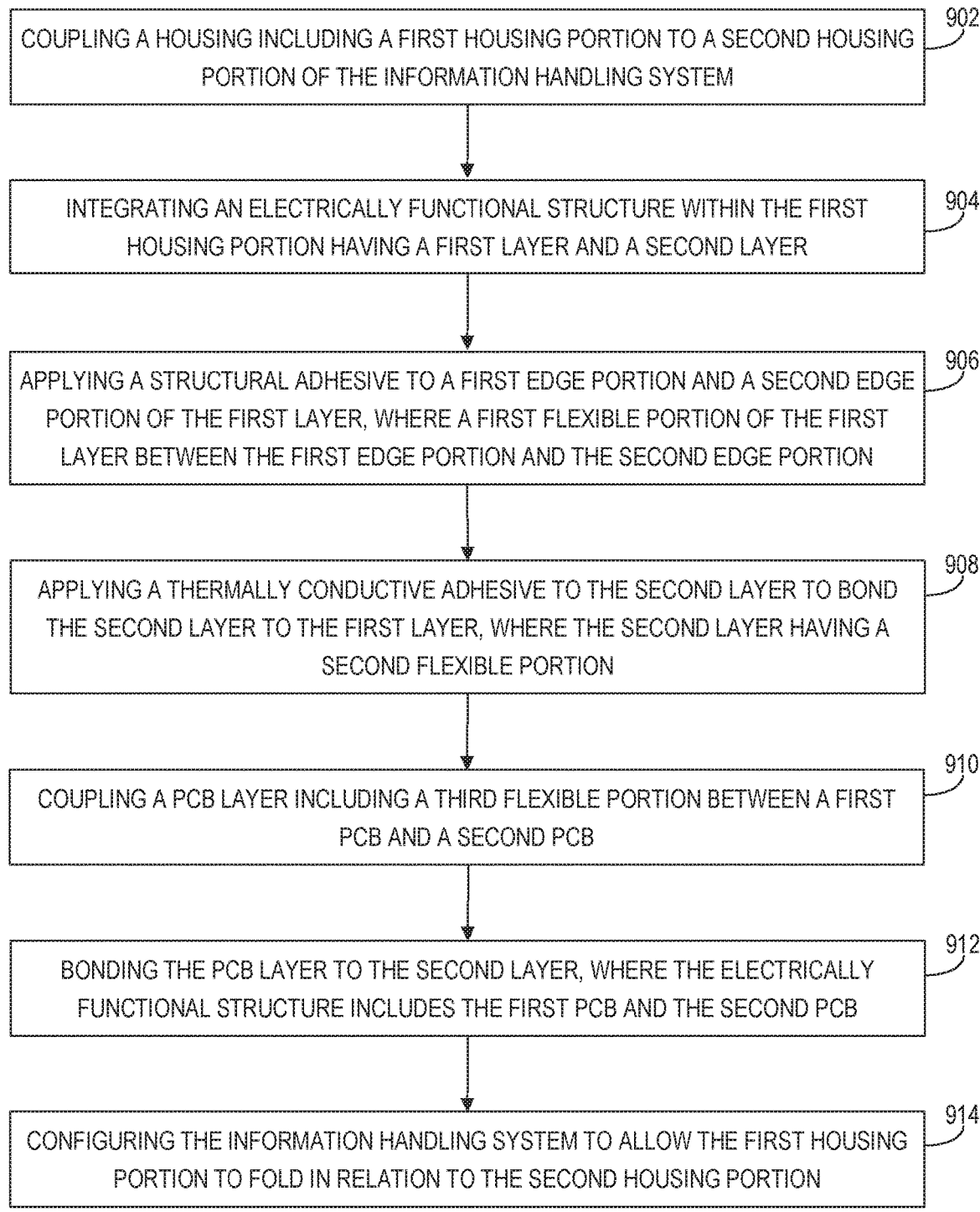
FIG. 9 is flowchart depicting selected elements of an embodiment of a method for integration of an electrically functional structure in a housing of an information handling system.

FIG. 9 is flowchart depicting selected elements of an embodiment of a method 900 method for integration of an electrically functional structure in a housing of an information handling system. It is noted that certain operations described in method 900 may be optional or may be rearranged in different embodiments.

Method 900 may begin at step 902, where method 900 may couple a housing including a first housing portion to a second housing portion of the information handling system. In step 904, method 900 may integrate an electrically functional structure within the first housing portion having a first layer and a second layer. In step 906, method 900 may apply a structural adhesive to a first edge portion and a second edge portion of the first layer, where a first flexible portion of the first layer between the first edge portion and the second edge portion. In step 908, method 900 may apply a thermally conductive adhesive to the second layer to bond the second layer to the first layer, where the second layer having a second flexible portion. In step 910, method 900 may couple a PCB layer including a third flexible portion between a first PCB and a second PCB. In step 912, method 900 may bond the PCB layer to the second layer, where the electrically functional structure includes the first PCB and the second PCB. In step 914, method 900 may configure the information handling system to allow the first housing portion to fold in relation to the second housing portion. After step 914, method 900 may end.

Figure 10:
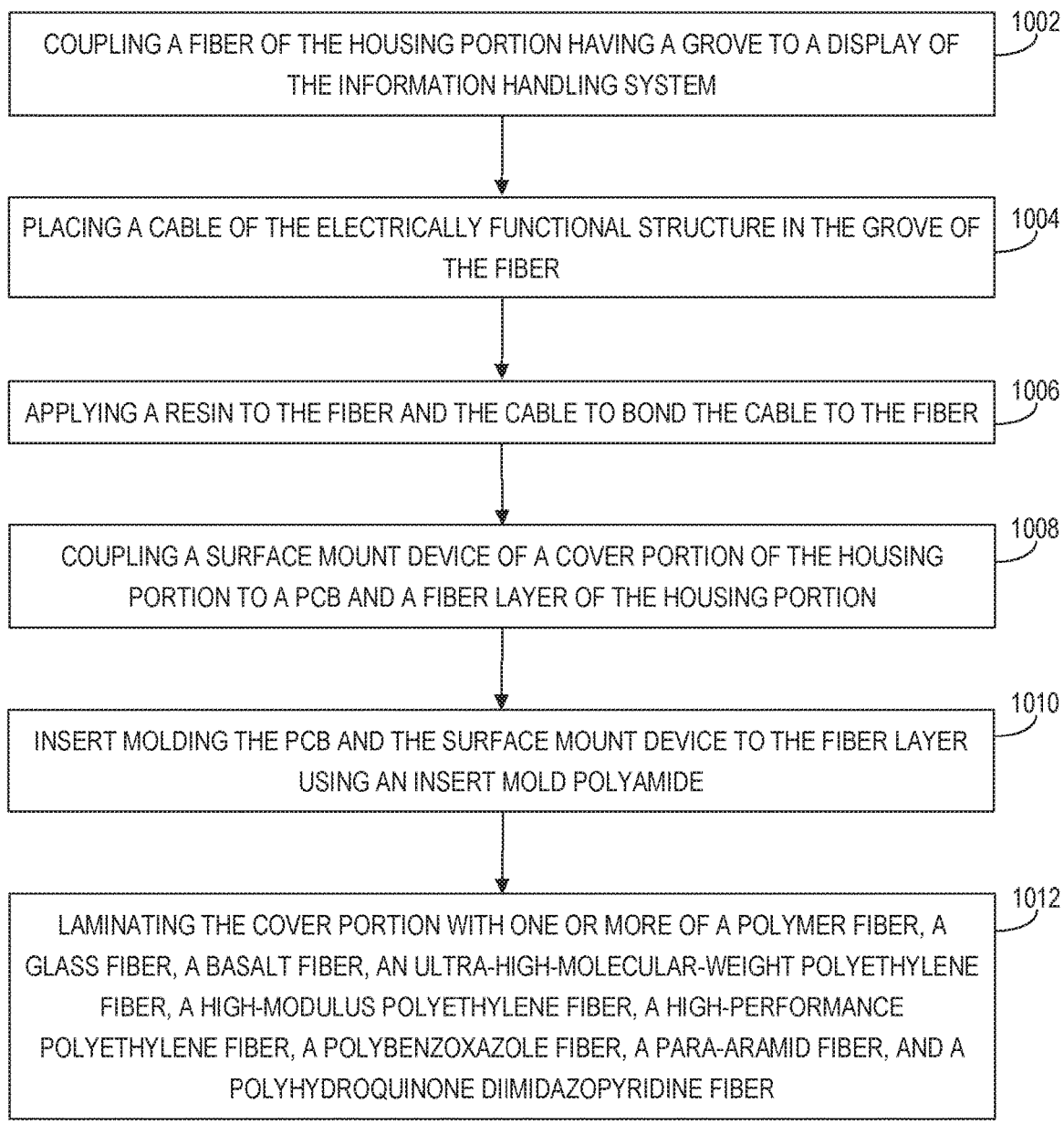
FIG. 10 is flowchart depicting selected elements of an embodiment of a method for integration of an electrically functional structure in a housing portion of an information handling system.

FIG. 10 is flowchart depicting selected elements of an embodiment of a method 1000 method for integration of an electrically functional structure in a housing portion of an information handling system. It is noted that certain operations described in method 1000 may be optional or may be rearranged in different embodiments.

Method 1000 may begin at step 1002, where method 1000 may couple a fiber of the housing portion having a grove to a display of the information handling system. In step 1004, method 1000 may place a cable of the electrically functional structure in the grove of the fiber. In step 1006, method 1000 may apply a resin to the fiber and the cable to bond the cable to the fiber. In step 1008, method 1000 may couple a surface mount device of a cover portion of the housing portion to a PCB and a fiber layer of the housing portion. In step 1010, method 1000 may insert mold the PCB and the surface mount device to the fiber layer using an insert mold polyamide. In step 1012, method 1000 may laminate the cover portion with one or more of a polymer fiber, a glass fiber, a basalt fiber, an ultra-high-molecular-weight polyethylene fiber, a high-modulus polyethylene fiber, a high-performance polyethylene fiber, a polybenzoxazole fiber, a para-aramid fiber, and a polyhydroquinone diimidazopyridine fiber. After step 1012, method 1000 may end.

Figure 11:
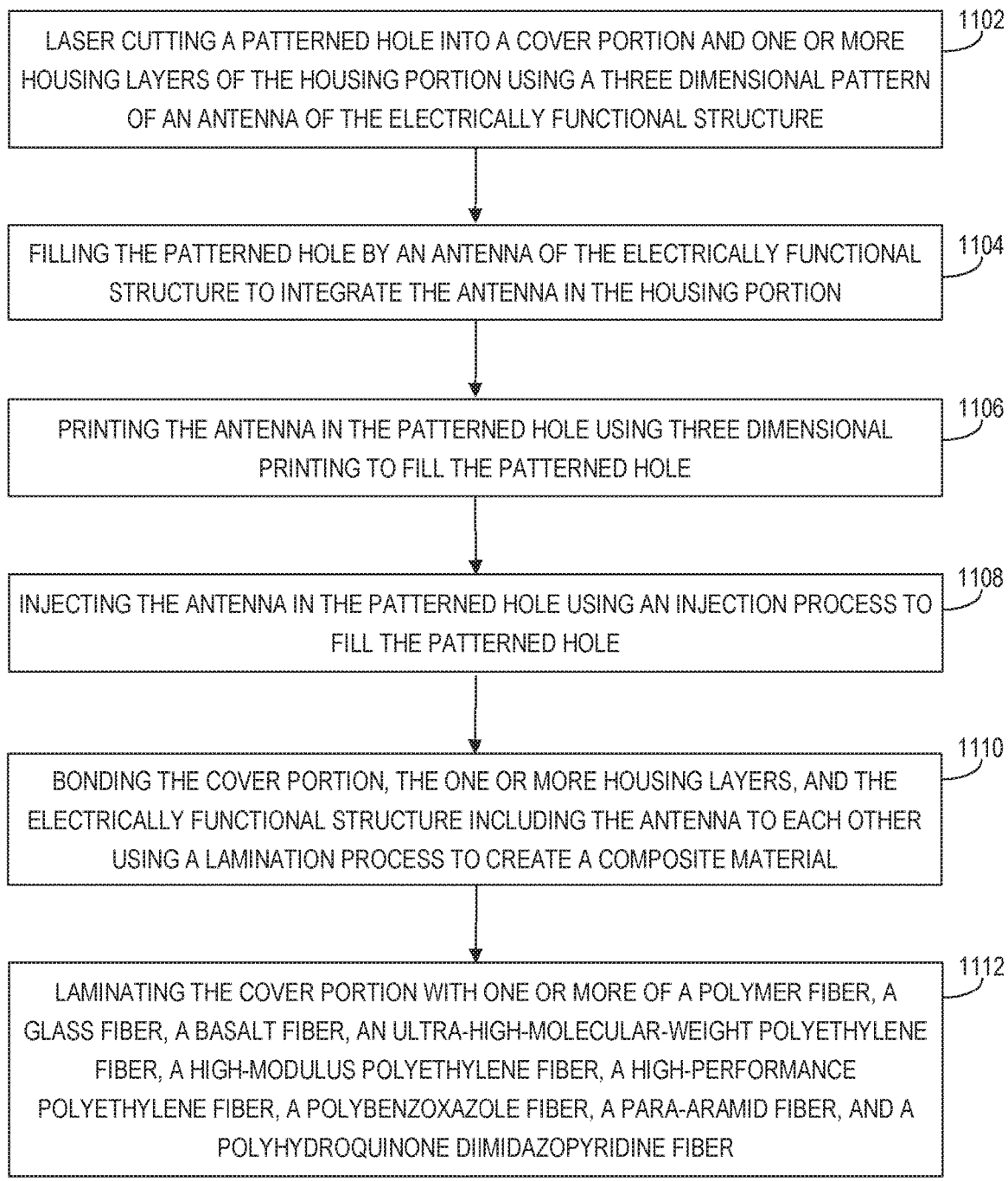
FIG. 11 is flowchart depicting selected elements of an embodiment of a method for integration of an electrically functional structure in a housing portion of an information handling system.

FIG. 11 is flowchart depicting selected elements of an embodiment of a method 1100 method for integration of an electrically functional structure in a housing portion of an information handling system. It is noted that certain operations described in method 1100 may be optional or may be rearranged in different embodiments.

Method 1100 may begin at step 1102, where method 1100 may laser cut a patterned hole into a cover portion and one or more housing layers of the housing portion using a three dimensional pattern of an antenna of the electrically functional structure. In step 1104, method 1100 may fill the patterned hole by an antenna of the electrically functional structure to integrate the antenna in the housing portion. In step 1106, method 1100 may print the antenna in the patterned hole using three dimensional printing to fill the patterned hole. In step 1108, method 1100 may inject the antenna in the patterned hole using an injection process to fill the patterned hole. In step 1110, method 1100 may bond the cover portion, the one or more housing layers, and the electrically functional structure including the antenna to each other using a lamination process to create a composite material. In step 1112, method 1100 may laminate the cover portion with one or more of a polymer fiber, a glass fiber, a basalt fiber, an ultra-high-molecular-weight polyethylene fiber, a high-modulus polyethylene fiber, a high-performance polyethylene fiber, a polybenzoxazole fiber, a para-aramid fiber, and a polyhydroquinone diimidazopyridine fiber. After step 1110, method 1100 may end.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
   a housing portion comprising:
   an electrically functional structure including an antenna;
   a cover portion;
   a plurality of housing layers including a plurality of openings, each of the plurality of housing layers including an opening of the plurality openings; and
   a patterned hole in the cover portion and the plurality housing layers, the patterned hole comprised of the plurality of openings and configured to match a three-dimensional size and shape of the antenna, each of the plurality of openings having a height and a width equal to a portion of the three dimensional pattern of the antenna at the respective opening, the patterned hole filled by the antenna to integrate the antenna in the housing portion, the cover portion, the one or more housing layers, and the electrically functional structure including the antenna bonded to each other using a lamination process to create a composite material.

2. The information handling system of claim 1, wherein the patterned hole is filled by the antenna using three dimensional printing to print the antenna in the patterned hole.

3. The information handling system of claim 1, wherein the patterned hole is filled by the antenna using an injection process to inject the antenna in the patterned hole.

4. The information handling system of claim 1, wherein the patterned hole is laser cut into the cover portion and the plurality of housing layers using the three dimensional pattern of the antenna.

5. The information handling system of claim 1, wherein the cover portion is laminated with one or more of a polymer fiber, a glass fiber, a basalt fiber, an ultra-high-molecular-weight polyethylene (UHMWPE) fiber, a high-modulus polyethylene (HMPE) fiber, a high-performance polyethylene (HPPE) fiber, a polybenzoxazole (PBO) fiber, a para-aramid fiber, and a polyhydroquinone diimidazopyridine (M5) fiber.

6. The information handling system of claim 1, wherein the antenna includes a ceramic antenna base.

\* \* \* \* \*